US012610181B2

(12) United States Patent
Tao et al.

(10) Patent No.: US 12,610,181 B2
(45) Date of Patent: Apr. 21, 2026

(54) INTEGRATED SOUNDING DEVICE

(71) Applicant: AAC Microtech (Changzhou) Co., Ltd., Jiangsu (CN)

(72) Inventors: Weiwei Tao, Changzhou (CN); Xin Jin, Changzhou (CN); Fan Zhang, Changzhou (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 184 days.

(21) Appl. No.: 18/757,356

(22) Filed: Jun. 27, 2024

(65) Prior Publication Data

US 2025/0301257 A1 Sep. 25, 2025

Related U.S. Application Data

(63) Continuation of application No. PCT/CN2024/082602, filed on Mar. 20, 2024.

(51) Int. Cl.
| | |
|---|---|
| *H04R 1/28* | (2006.01) |
| *H04R 1/02* | (2006.01) |
| *H04R 7/12* | (2006.01) |
| *H04R 9/02* | (2006.01) |
| *H05K 1/182* | (2026.01) |

(52) U.S. Cl.
CPC ............. *H04R 1/288* (2013.01); *H04R 1/025* (2013.01); *H04R 7/122* (2013.01); *H04R 7/127* (2013.01); *H04R 9/025* (2013.01);

*H05K 1/182* (2013.01); *H04R 2400/11* (2013.01); *H05K 2201/10083* (2013.01)

(58) Field of Classification Search
CPC ........ H04R 1/288; H04R 1/025; H04R 7/122; H04R 7/127; H04R 9/025; H04R 2400/11; H04R 9/06; H04R 7/14; H04R 2209/027; H04R 7/20; H04R 2499/11; H05K 1/182; H05K 2201/10083
See application file for complete search history.

(56) References Cited

FOREIGN PATENT DOCUMENTS

CN 117425114 A * 1/2024 ............... H04R 9/06

* cited by examiner

*Primary Examiner* — Tuan D Nguyen
(74) *Attorney, Agent, or Firm* — Wiersch Law Group

(57) ABSTRACT

An integrated sounding device is disclosed. The integrated sounding device includes a housing having a sound outlet, a speaker unit and a fixing member. The speaker unit includes a diaphragm having a first suspension, a second suspension and a dome. The fixing member connects an inner fixing part of the second suspension and the housing. The dome includes a first side close to the sound outlet and a second side far away from the sound outlet. The two sides are respectively arranged at opposite sides of the fixing member. The first side has a first groove, and the second side has a second groove. A filler for balancing amplitudes of the two sides is provided in the first groove. The integrated sounding device can balance the acoustic mass of the vibration system, so as to balance the vibrations of the vibration system and eliminate the sound distortions.

10 Claims, 3 Drawing Sheets

A–A

100

A–A

B-B

20

INTEGRATED SOUNDING DEVICE

FIELD OF THE PRESENT DISCLOSURE

The present disclosure relates to electroacoustic transducers, in particular to an integrated sounding device.

DESCRIPTION OF THE RELATED ART

With the development of electronic technology, portable consumer electronic products, such as mobile phones, handheld game consoles, navigation devices and handheld multimedia entertainment devices, are becoming more and more popular. These portable consumer electronic products usually use integrated sounding devices for sound prompts, such as incoming call prompts and navigation prompts.

An integrated sounding device in the related art includes a housing having a containing space, a speaker unit disposed in the containing space and dividing the containing space into a front cavity and a back cavity, and a fixing member disposed in the front cavity and connecting the housing and the speaker unit. One side of the housing is provided with a sound outlet communicating with the front cavity. When a vibration system of the speaker unit vibrates for generating sounds, the large difference in gas flow rate in the front cavity between one position far away from the sound outlet and another position close to the sound outlet causes unbalanced acoustic mass further a large difference in amplitude between the two positions of the vibration system, as a result, the vibration system vibrates unevenly and the sounds distort.

Thus, it is necessary to provide a novel integrated sounding device to solve the problems.

SUMMARY

An objective of the present disclosure is to overcome the above problems and provide an integrated sounding device which can balance the acoustic mass of the vibration system, so as to balance the vibrations of the vibration system and eliminate the sound distortions.

In order to achieve the objective mentioned above, the present disclosure discloses an integrated sounding device including a housing having a containing space, a speaker unit disposed in the containing space and dividing the containing space into a front cavity and a back cavity, and a fixing member. The housing includes an upper housing and a lower housing engaged with the upper housing. A side of the upper housing is provided with a sound outlet communicating with the front cavity. The speaker unit includes a frame, a vibration system fixed to the frame and a magnetic circuit system for driving the vibration system. The magnetic circuit system includes a bottom plate spaced apart from the lower housing, a main magnetic member disposed on the bottom plate and a secondary magnetic member disposed around the main magnetic member for forming a magnetic gap. The vibration system includes a diaphragm fixed to the frame and a voice coil locates in the magnetic gap. The diaphragm includes a first suspension fixed to the frame, a second suspension surrounded by the first suspension and a dome connecting the first suspension and the second suspension. The second suspension includes an inner fixing part fixed to the main magnetic member. The fixing member connects the inner fixing part and the upper housing. The dome includes a first side close to the sound outlet and a second side far away from the sound outlet. The first side and the second side are respectively arranged at one pair of opposite sides of the fixing member. The first side is provided with a first groove, and the second side is provided with a second groove. A filler for balancing amplitudes of the first side and the second side is provided in the first groove.

As an improvement, the vibration system further includes a skeleton connecting the diaphragm and the voice coil. The skeleton includes a main part, two support arms extending from an outer edge of the main part toward the bottom plate and an extension part extending from an inner edge of the main part toward the bottom plate. The voice coil is fixed to the extension part. The two support arms are respectively arranged at another pair of opposite sides of the fixing member. The main part acts as the dome, and the main part is provided with the first groove and the second groove.

As an improvement, the first suspension is depressed toward the lower housing. The second suspension bulges toward the upper housing. An inner edge of the first suspension is fixed to the main part. An outer edge of the first suspension extends an outer fixing part attached to an outer surface of the frame. An outer edge of the second suspension is fixed to the extension part.

As an improvement, the main magnetic member includes a first main magnet disposed on the bottom plate, a main yoke disposed on the first main magnet, a second main magnet disposed on the main yoke and a third main magnet disposed on the second main magnet. The inner fixing part includes a flat part fixed to the second main magnet and a hollow protrusion extending from the flat part toward the upper housing. The third main magnet is contained within the hollow protrusion. The secondary magnetic member includes a plurality of secondary magnets disposed on the bottom plate and surrounding the main magnetic member, and a secondary yoke disposed on the plurality of secondary magnets. The secondary yoke is fixed to the frame and has a third groove for avoiding the first suspension.

As an improvement, the vibration system further includes two flexible circuit boards spaced apart from the diaphragm. Each flexible circuit board connects one corresponding support arm and the frame. A surface of each flexible circuit board far away from the diaphragm is provided with an auxiliary diaphragm. The voice coil electrically connects with one of the two flexible circuit boards. An outer edge of the one of the two flexible circuit boards extends outward to form an outer connecting part. The outer connecting part is provided with at least one positioning hole fixed with the upper housing. An inner edge of the one of the two flexible circuit boards extends an inner connecting part fixed to a surface of the main part far away from the diaphragm. A coil lead of the voice coil electrically connects with the inner connecting part.

As an improvement, the filler is an accessional rubber patch filled in the first groove, or a reinforcing dome filled in the first groove.

As an improvement, the lower housing is provided with a leakage hole communicating the back cavity and the outside.

As an improvement, the skeleton and the diaphragm are formed integrally.

As an improvement, a first spacer and a second spacer are sandwiched between the bottom plate and the lower housing for supporting the speaker unit. The first spacer and the second spacer have different thicknesses in a direction from the upper housing to the lower housing.

As an improvement, the second main magnet and the third main magnet are integrated.

In the integrated sounding device according to the present disclosure, based on the position of the sound outlet, the dome includes the first side close to the sound outlet and the second side far away from the sound outlet, the first side is provided with the first groove, the second side is provided with the second groove, the filler is accordingly provided in the first groove in order to balance the acoustic mass of the first side and the second side and further balance amplitudes of the first side and the second side, so as to balance the vibrations of the vibration system and eliminate the sound distortions.

BRIEF DESCRIPTION OF THE DRAWINGS

In order to more clearly illustrate the technical solutions in embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art based on the accompanying drawings without creative efforts, wherein.

REFERENCE NUMBERS

100: integrated sounding device; 10: housing; 10a: containing space; 10a1: front cavity; 10a2: back cavity; 11: upper housing; 12: lower housing; 11a: sound outlet; 12a: leakage hole; 20: speaker unit; 21: frame; 22: vibration system; 22a: diaphragm; 221: first suspension; 2211: outer fixing part; 222: second suspension; 2221: inner fixing part; 2222: flat part; 2223: hollow protrusion; 223: dome; 2231: first side; 2232: second side; 2233: first groove; 2234: second groove; 2235: filler; 22b: skeleton; 224: main part; 225: support arm; 226: extension part; 22c: voice coil; 227: coil lead; 22d: flexible circuit board; 228: outer connecting part; 2281: positioning hole; 229: inner connecting part; 22e: auxiliary diaphragm; 23: magnetic circuit system; 23a: bottom plate; 231: magnetic gap; 23b: main magnetic member; 232: first main magnet; 233: main yoke; 234: second main magnet; 235: third main magnet; 23c: secondary magnetic member; 236: secondary magnet; 237: secondary yoke; 2371: third groove; 30: fixing member; 41: first spacer; 42: second spacer.

DETAILED DESCRIPTION OF THE EMBODIMENTS

The technical solutions in embodiments of the present disclosure will be described clearly and completely below with reference to the accompanying drawings in the embodiments of the present disclosure. It is apparent that, the described embodiments are merely some of rather than all of the embodiments of the present disclosure. All other embodiments acquired by those of ordinary skill in the art without creative efforts based on the embodiments of the present disclosure shall fall within the protection scope of the present disclosure.

Figure 1:
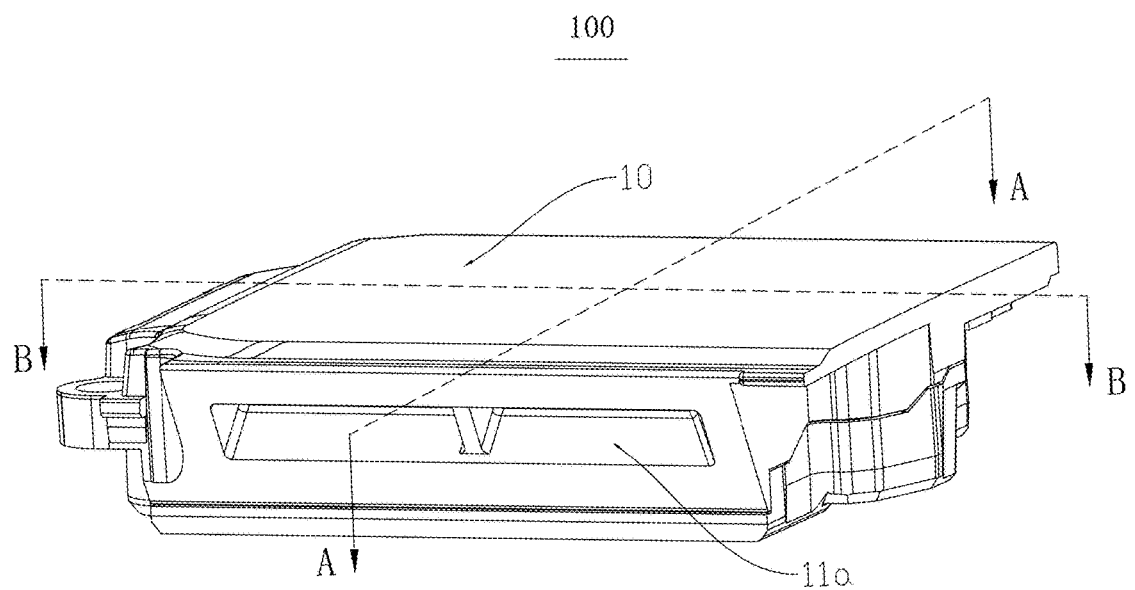
FIG. 1 is an isometric view of an integrated sounding device in accordance with an exemplary embodiment of the present disclosure.
Figure 2:
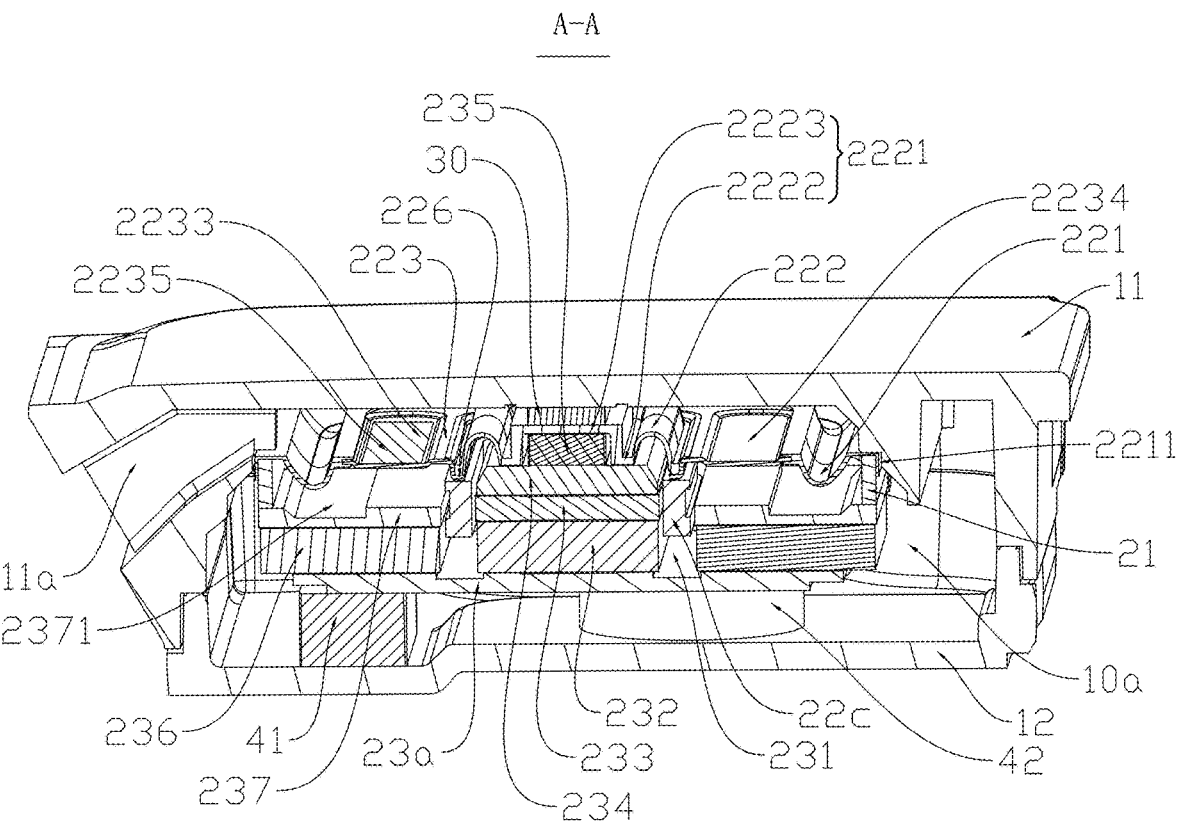
FIG. 2 is a cross-sectional view of the integrated sounding device, taken along line A-A in FIG. 1.
Figure 3:
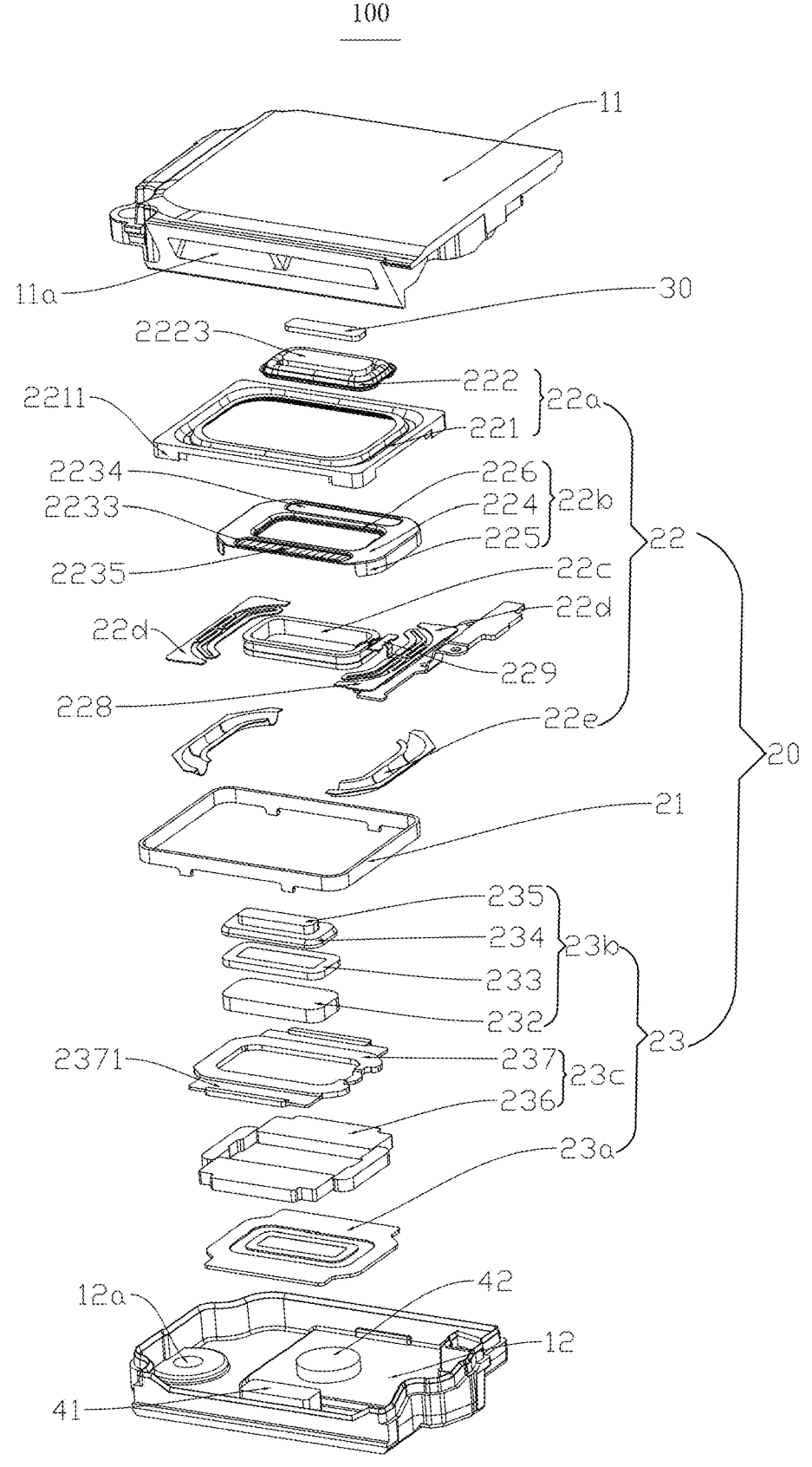
FIG. 3 is an exploded view of the integrated sounding device in FIG. 1.
Figure 4:
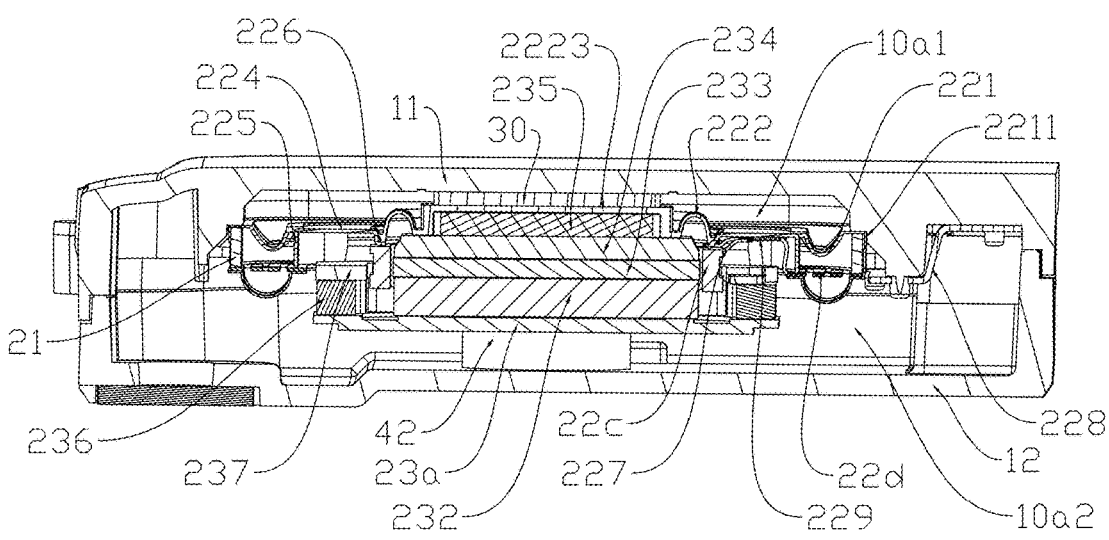
FIG. 4 is a cross-sectional view of the integrated sounding device, taken along line B-B in FIG. 1.
Figure 5:
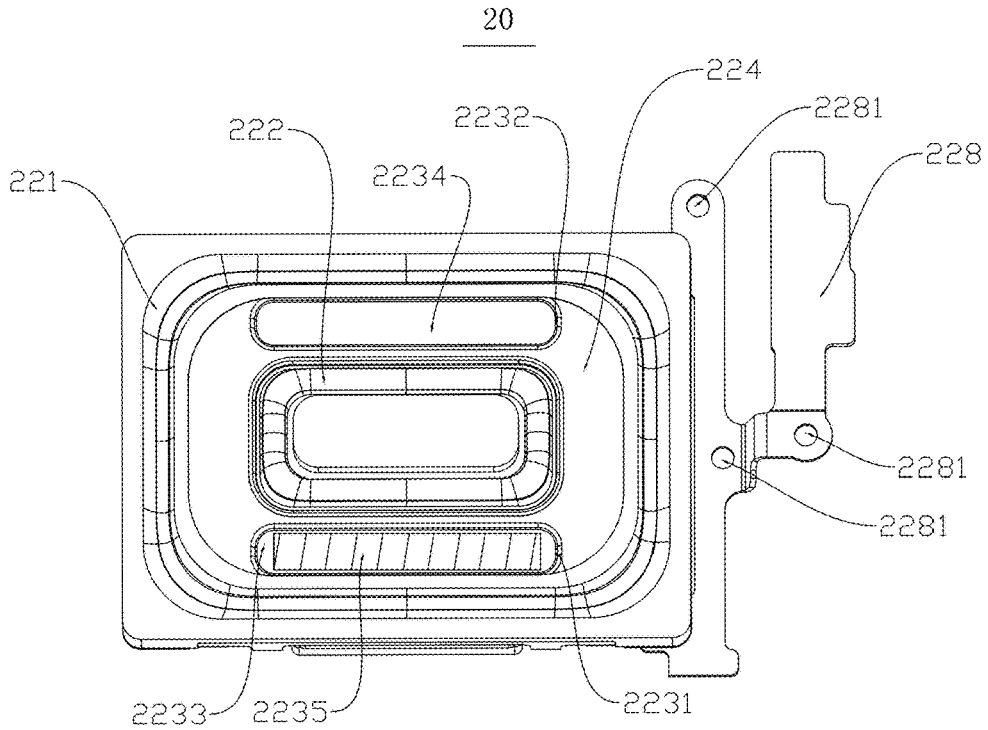
FIG. 5 is an isometric view of a speaker unit of the integrated sounding device in FIG. 1.

Referring to FIGS. 1-5, the present disclosure discloses an integrated sounding device 100. The integrated sounding device 100 includes a housing 10 having a containing space 10a, and a speaker unit 20 disposed in the containing space 10a and dividing the containing space 10a into a front cavity 10a1 and a back cavity 10a2. The housing 10 includes an upper housing 11 and a lower housing 12 engaged with the upper housing 11. A side of the upper housing 11 is provided with a sound outlet 11a communicating with the front cavity 10a1. The back cavity 10a2 can be filled with sound-absorbing materials for improving the low-frequency of the integrated sounding device 100.

The speaker unit 20 includes a frame 21, a vibration system 22 fixed to the frame 21 and a magnetic circuit system 23 for driving the vibration system 22.

The magnetic circuit system 23 includes a bottom plate 23a spaced apart from the lower housing 12, a main magnetic member 23b disposed on the bottom plate 23a and a secondary magnetic member 23c disposed around the main magnetic member 23b for forming a magnetic gap 231. The main magnetic member 23b includes a first main magnet 232 disposed on the bottom plate 23a, a main yoke 233 disposed on the first main magnet 232, a second main magnet 234 disposed on the main yoke 233 and a third main magnet 235 disposed on the second main magnet 234. The secondary magnetic member 23c includes a plurality of secondary magnets 236 disposed on the bottom plate 23a and surrounding the main magnetic member 23b, and a secondary yoke 237 disposed on the plurality of secondary magnets 236. In this embodiment, an amount of the secondary magnets 236 is four, the four secondary magnets 236 are arranged symmetrically about main magnetic member 23b.

The vibration system 22 includes a diaphragm 22a fixed to the frame 21 and a voice coil 22c locates in the magnetic gap 231. The diaphragm 22a includes a first suspension 221 fixed to the frame 21, a second suspension 222 surrounded by the first suspension 221 and a dome 223 connecting the first suspension 221 and the second suspension 222.

The second suspension 222 includes an inner fixing part 2221 fixed to the main magnetic member 23b. The inner fixing part 2221 includes a flat part 2222 fixed to the second main magnet 234 and a hollow protrusion 2223 extending from the flat part 2222 toward the upper housing 11. The third main magnet 235 is contained within the hollow protrusion 2223.

The integrated sounding device 100 further includes a fixing member 30. The fixing member 30 connects the inner fixing part 2221 and the upper housing 11. Optionally, the fixing member 30 locates on the hollow protrusion 2223.

The dome 223 includes a first side 2231 close to the sound outlet 11a and a second side 2232 far away from the sound outlet 11a. The first side 2231 and the second side 2232 are respectively arranged at one pair of opposite sides of the fixing member 30. The first side 2231 is provided with a first groove 2233, and the second side 2232 is provided with a second groove 2234. A filler 2235 for balancing amplitudes of the first side 2231 and the second side 2232 is provided in the first groove 2233. The filler 2235 can be an accessional rubber patch filled in the first groove 2233, or a reinforcing dome filled in the first groove 2233. The filler 2235 can increase the mass of the first side 2231, so as to balance the acoustic mass of the first side 2231 and the second side 2232 and further balance amplitudes of the first side 2231 and the second side 2232. Based on the position of the sound outlet 11a, the filler 2235 is accordingly provided in the first groove 2233, so as to easily match housings having different sound outlet positions.

The secondary yoke 237 is fixed to the frame 21. The secondary yoke 237 has a third groove 2371 for avoiding the first suspension 221, so as to provide sufficient vibration space for the first suspension 221 and avoid the first suspension 221 from impacting the secondary yoke 237.

The vibration system 22 further includes a skeleton 22b connecting the diaphragm 22a and the voice coil 22c. The skeleton 22b includes a main part 224, two support arms 225 extending from an outer edge of the main part 224 toward the bottom plate 23a and an extension part 226 extending from an inner edge of the main part 224 toward the bottom plate 23a. The voice coil 22c is fixed to the extension part 226. The two support arms 225 are respectively arranged at another pair of opposite sides of the fixing member 30. The main part 224 acts as the dome 223, and the main part 224 is provided with the first groove 2233 and the second groove 2234.

The first suspension 221 is depressed toward the lower housing 12. The second suspension 222 bulges toward the upper housing 11. An inner edge of the first suspension 221 is fixed to the main part 224. An outer edge of the first suspension 221 extends an outer fixing part 2211 attached to an outer surface of the frame 21 to ensure a stable connection between the frame 21 and the first suspension 221. An outer edge of the second suspension 222 is fixed to the extension part 226 to ensure a stable connection between the skeleton 22b and the second suspension 222.

The vibration system 22 further includes two flexible circuit boards 22d spaced apart from the diaphragm 22a. The two flexible circuit boards 22d are respectively arranged at the another pair of opposite sides of the fixing member 30. Each flexible circuit board 22d connects one corresponding support arm 225 and the frame 21. A surface of each flexible circuit board 22d far away from the diaphragm 22a is provided with an auxiliary diaphragm 22e. The flexible circuit board 22d and the auxiliary diaphragm 22e can effectively inhibit the lateral vibration of the diaphragm 22a and improve the reliability and stability of the vertical vibration of the diaphragm 22a. The voice coil 22c electrically connects with one of the two flexible circuit boards 22d.

An outer edge of the one of the two flexible circuit boards 22d extends outward to form an outer connecting part 228. The outer connecting part 228 is provided with at least one positioning hole 2281 fixed with the upper housing 11. An inner edge of the one of the two flexible circuit boards 22d extends an inner connecting part 229 fixed to a surface of the main part 224 far away from the diaphragm 22a. A coil lead 227 of the voice coil 22c electrically connects with the inner connecting part 229.

The lower housing 12 is provided with a leakage hole 12a communicating the back cavity 10a2 and the outside for balancing the air pressure.

In this embodiment, in order to simplify the assembly process of the integrated sounding device 100, the skeleton 22b and the diaphragm 22a can be formed integrally. The second main magnet 234 and the third main magnet 235 can be integrated.

In order to make the speaker unit 20 locate in the housing 10 firmly, a first spacer 41 and a second spacer 42 are sandwiched between the bottom plate 23a and the lower housing 12 for supporting the speaker unit 20. The first spacer 41 and the second spacer 42 have different thick-nesses in a direction from the upper housing 11 to the lower housing 12, so as to easily match housings having different shapes and sizes.

In the integrated sounding device 100 according to the present disclosure, based on the position of the sound outlet 11a, the dome 223 includes the first side 2231 close to the sound outlet 11a and the second side 2232 far away from the sound outlet 11a, the first side 2231 is provided with the first groove 2233, the second side 2232 is provided with the second groove 2234, the filler 2235 is accordingly provided in the first groove 2233 in order to balance the acoustic mass of the first side 2231 and the second side 2232 and further balance amplitudes of the first side 2231 and the second side 2232, so as to balance the vibrations of the vibration system 22 and eliminate the sound distortions.

The above are only embodiments of the present disclosure. It should be pointed out that those of ordinary skill in the art may also make improvements without departing from the ideas of the present disclosure, all of which fall within the protection scope of the present disclosure.

What is claimed is:

1. An integrated sounding device, comprising:
a housing having a containing space;
a speaker unit disposed in the containing space and dividing the containing space into a front cavity and a back cavity; and
a fixing member,
wherein the housing comprises an upper housing and a lower housing engaged with the upper housing; a side of the upper housing is provided with a sound outlet communicating with the front cavity; the speaker unit comprises a frame, a vibration system fixed to the frame and a magnetic circuit system for driving the vibration system; the magnetic circuit system comprises a bottom plate spaced apart from the lower housing, a main magnetic member disposed on the bottom plate and a secondary magnetic member disposed around the main magnetic member for forming a magnetic gap; the vibration system comprises a diaphragm fixed to the frame and a voice coil locates in the magnetic gap; the diaphragm comprises a first suspension fixed to the frame, a second suspension surrounded by the first suspension and a dome connecting the first suspension and the second suspension; the second suspension comprises an inner fixing part fixed to the main magnetic member; the fixing member connects the inner fixing part and the upper housing; the dome comprises a first side close to the sound outlet and a second side far away from the sound outlet; the first side and the second side are respectively arranged at one pair of opposite sides of the fixing member; the first side is provided with a first groove, and the second side is provided with a second groove; a filler for balancing amplitudes of the first side and the second side is provided in the first groove.

2. The integrated sounding device as described in claim 1, wherein the vibration system further comprises a skeleton connecting the diaphragm and the voice coil; the skeleton comprises a main part, two support arms extending from an outer edge of the main part toward the bottom plate and an extension part extending from an inner edge of the main part toward the bottom plate; the voice coil is fixed to the extension part; the two support arms are respectively arranged at another pair of opposite sides of the fixing member; the main part acts as the dome, and the main part is provided with the first groove and the second groove.

3. The integrated sounding device as described in claim 2, wherein the first suspension is depressed toward the lower housing; the second suspension bulges toward the upper housing; an inner edge of the first suspension is fixed to the main part; an outer edge of the first suspension extends an outer fixing part attached to an outer surface of the frame; an outer edge of the second suspension is fixed to the extension part.

4. The integrated sounding device as described in claim 2, wherein the vibration system further comprises two flexible circuit boards spaced apart from the diaphragm; each flexible circuit board connects one corresponding support arm and the frame; a surface of each flexible circuit board far away from the diaphragm is provided with an auxiliary diaphragm; the voice coil electrically connects with one of the two flexible circuit boards; an outer edge of the one of the two flexible circuit boards extends outward to form an outer connecting part; the outer connecting part is provided with at least one positioning hole fixed with the upper housing; an inner edge of the one of the two flexible circuit boards extends an inner connecting part fixed to a surface of the main part far away from the diaphragm; a coil lead of the voice coil electrically connects with the inner connecting part.

5. The integrated sounding device as described in claim 2, wherein the skeleton and the diaphragm are formed integrally.

6. The integrated sounding device as described in claim 1, wherein the main magnetic member comprises a first main magnet disposed on the bottom plate, a main yoke disposed on the first main magnet, a second main magnet disposed on the main yoke and a third main magnet disposed on the second main magnet; the inner fixing part comprises a flat part fixed to the second main magnet and a hollow protrusion extending from the flat part toward the upper housing; the third main magnet is contained within the hollow protrusion; the secondary magnetic member comprises a plurality of secondary magnets disposed on the bottom plate and surrounding the main magnetic member, and a secondary yoke disposed on the plurality of secondary magnets; the secondary yoke is fixed to the frame and has a third groove for avoiding the first suspension.

7. The integrated sounding device as described in claim 6, wherein the second main magnet and the third main magnet are integrated.

8. The integrated sounding device as described in claim 1, wherein the filler is an accessional rubber patch filled in the first groove, or a reinforcing dome filled in the first groove.

9. The integrated sounding device as described in claim 1, wherein the lower housing is provided with a leakage hole communicating the back cavity and the outside.

10. The integrated sounding device as described in claim 1, wherein a first spacer and a second spacer are sandwiched between the bottom plate and the lower housing for supporting the speaker unit, the first spacer and the second spacer have different thicknesses in a direction from the upper housing to the lower housing.

\* \* \* \* \*